United States Patent
Ewen et al.

(10) Patent No.: US 6,735,731 B2
(45) Date of Patent: May 11, 2004

(54) ARCHITECTURE FOR BUILT-IN SELF-TEST OF PARALLEL OPTICAL TRANSCEIVERS

(75) Inventors: John F. Ewen, Rochester, MN (US); David W. Siljenberg, Byron, MN (US); Stephen C. Wilkinson-Gruber, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 468 days.

(21) Appl. No.: 09/803,077

(22) Filed: Mar. 9, 2001

(65) Prior Publication Data

US 2002/0129311 A1 Sep. 12, 2002

(51) Int. Cl.$^7$ ............................................... G01R 31/28
(52) U.S. Cl. ..................................................... 714/733
(58) Field of Search ................................ 714/733, 716, 714/30; 389/22, 128, 135; 385/89

(56) References Cited

U.S. PATENT DOCUMENTS

| | | | |
|---|---|---|---|
| 5,228,042 A | 7/1993 | Gauthier et al. | 714/716 |
| 5,781,682 A | 7/1998 | Cohen et al. | 385/89 |
| 6,012,855 A | 1/2000 | Hahn | 385/89 |
| 6,201,829 B1 * | 3/2001 | Schneider | 375/221 |

OTHER PUBLICATIONS

Texas Instruments, 1.0Gb to 1.6Gb Small Form–Factor Ethernet Transceiver, Oct. 2000, Texas Instruments, p. 1–18.*

Dallas Semiconductor, 3.3V Bit Error Rate Tester (BERT), Oct. 2000, Dallas Semiconductor, p. 1–22.*

Lin et al., A bist Methodology for at speed testing of data communications Transceivers, 2000, IEEE, p. 216–221.*

U.S. patent application Ser. No. 09/689,758, filed Oct. 13, 2000.

* cited by examiner

Primary Examiner—Albert Decady
Assistant Examiner—Shelly A Chase
(74) Attorney, Agent, or Firm—Moser, Patterson & Sheridan LLP

(57) ABSTRACT

Method and apparatus for testing a parallel optical transceiver are provided. One embodiment provides a built-in self-testing (BIST) parallel optical transceiver comprising a full-rate clock test pattern generator and a clock divider circuit connected to provide a half-rate clock signal to one of the one or more transmitter channels, and an error detector comprising one or more error detection circuits connected to one or more receiver channels and configured to receive the half-rate clock signal. Another embodiment provides a method for testing a parallel optical transceiver, comprising: generating a full-rate clock test pattern to one or more transmitter channels; providing a half-rate clock signal to one of the one or more transmitter channels utilizing a clock divider circuit; transmitting test pattern and half-rate clock signals to one or more corresponding receiver channels; and detecting error utilizing one or more error detection circuits connected to receive the half-rate clock signal.

28 Claims, 6 Drawing Sheets

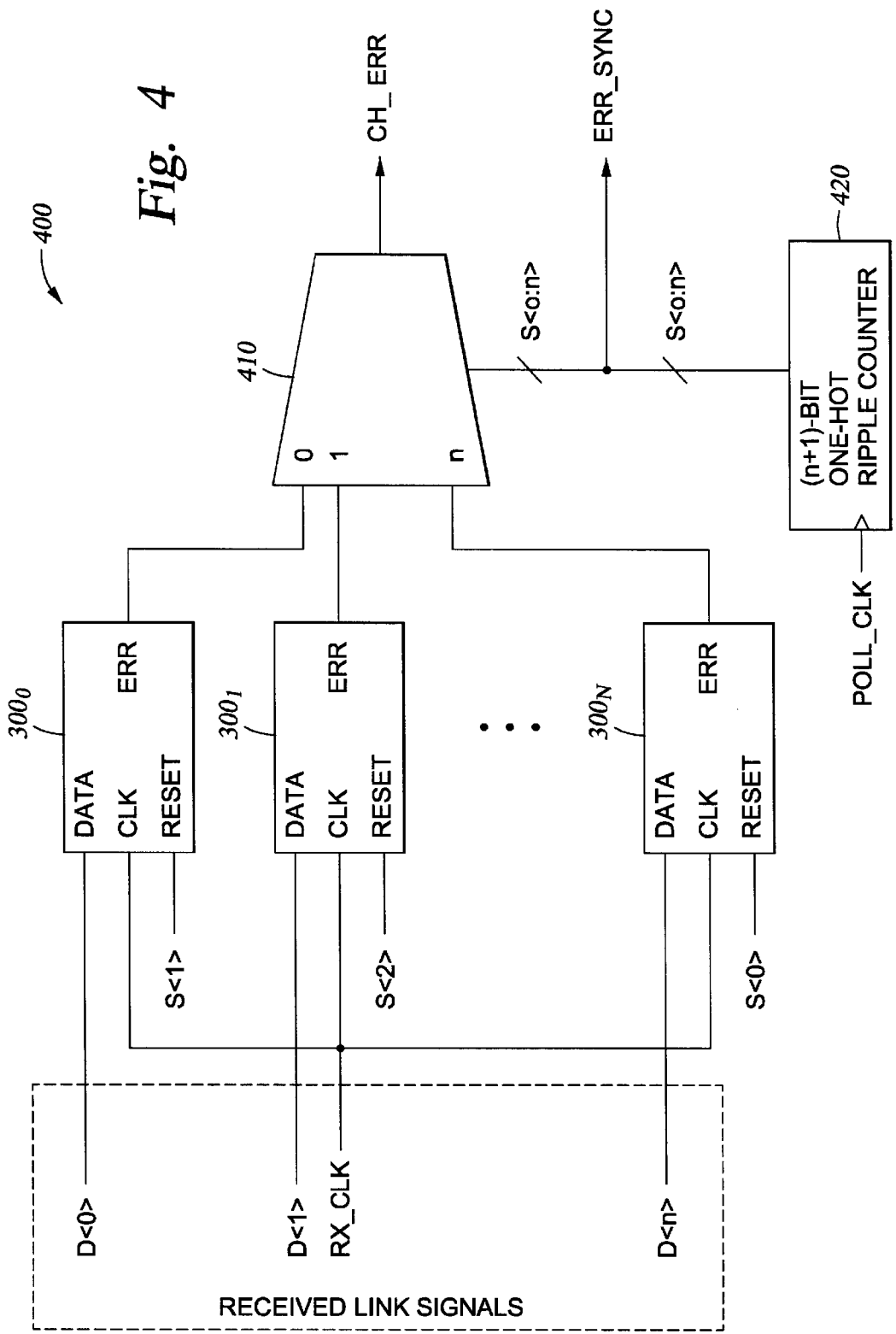

ARCHITECTURE FOR BUILT-IN SELF-TEST OF PARALLEL OPTICAL TRANSCEIVERS

BACKGROUND OF THE INVENTION

1. Field of the Invention

The present invention generally relates to testing of optical transceivers. More particularly, the invention relates to built-in self-test of parallel optical transceivers.

2. Background of the Related Art

The growth of electronic commerce, particularly via the internet, has produced exponential increases in the demand for communication bandwidth for computer networks as well as data storage and retrieval networks. In response to the communication bandwidth needs, optical fiber-based data communication devices are being developed. Most previously known optical link development has focused on serial transceivers (or transmitters and receivers). Recently, the focus has shifted to development of parallel transceivers because of the potential for high aggregate bandwidth and lower costs. Furthermore, parallel transceivers may be designed to handle data which has not been coded or serialized for transmission, which may replace wired buses and connect computers at higher data rates and over longer distances.

However, reliable manufacture and low-cost testing of parallel transceivers pose a number of problems, and manufacturing yields can be reduced significantly due to increased complexity in both chip and module construction. Since testing equipment for parallel transceivers are generally unavailable, utilizing conventional testing equipment and method designed for testing serial transceivers multiplies the testing time when applied to parallel transceivers. Furthermore, existing test equipment are not designed to handle the electrical interface of DC-coupled transceivers. Also, present limitations of the opto-electronic components also require that full-rate testing of a parallel optical transceiver does not rely on transmission of a full-rate clock signal.

Therefore, there is a need for a built-in self-test (BIST) circuit disposed on a parallel optical transceiver which may be utilized in development and manufacturing test and field debug of the parallel optical transceiver. It is desirable for the BIST to serve as a preliminary screen of proper link functions of the parallel optical transceiver. For debugging purposes, it is further desirable for the BIST to identify the faulty channel(s) of the parallel optical transceiver. It is also desirable for the BIST to exercise optical links with full-rate data patterns that closely resemble those transmitted in typical functional or operational mode.

SUMMARY OF THE INVENTION

One embodiment provides a built-in self-testing (BIST) parallel optical transceiver comprising a full-rate clock test pattern generator connected to one or more transmitter channels, a clock divider circuit connected to provide a half-rate clock signal to one of the one or more transmitter channels, and an error detector comprising one or more error detection circuits connected to one or more receiver channels, the one or more error detection circuits configured to receive the half-rate clock signal. Each error detection circuit may comprise a first scan chain comprising a plurality of rising-edge-triggered flip-flops configured to receive the half-rate clock signal, a second scan chain comprising a plurality of falling-edge-triggered flip-flops configured to receive the half-rate clock signal, and an error output connected to the first and second scan chains.

Another embodiment provides an apparatus for testing a parallel optical transceiver, comprising: a full-rate clock test pattern generator connected to one or more transmitter channels of the parallel optical transceiver; a clock divider circuit connected to provide a half-rate clock signal to one of the one or more transmitter channels; an error detector comprising one or more error detection circuits connected to one or more receiver channels of the parallel optical transceiver, the one or more error detection circuits configured to receive the half-rate clock signal; and a test fixture comprising optical connections connecting outputs of the one or more transmitter channels to inputs of the one or more receiver channels.

Another embodiment provides a method for testing a parallel optical transceiver, comprising: generating a full-rate clock test pattern to one or more transmitter channels; providing a half-rate clock signal to one of the one or more transmitter channels utilizing a clock divider circuit; transmitting full-rate clock test pattern and half-rate clock signal through the one or more transmitter channels to one or more corresponding receiver channels; and detecting error utilizing an error detector comprising one or more error detection circuits connected to the one or more receiver channels, the one or more error detection circuits configured to receive the half-rate clock signal.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a schematic diagram of one embodiment of a multiplexed error detector.

DETAILED DESCRIPTION OF THE PREFERRED EMBODIMENT

Figure 1:
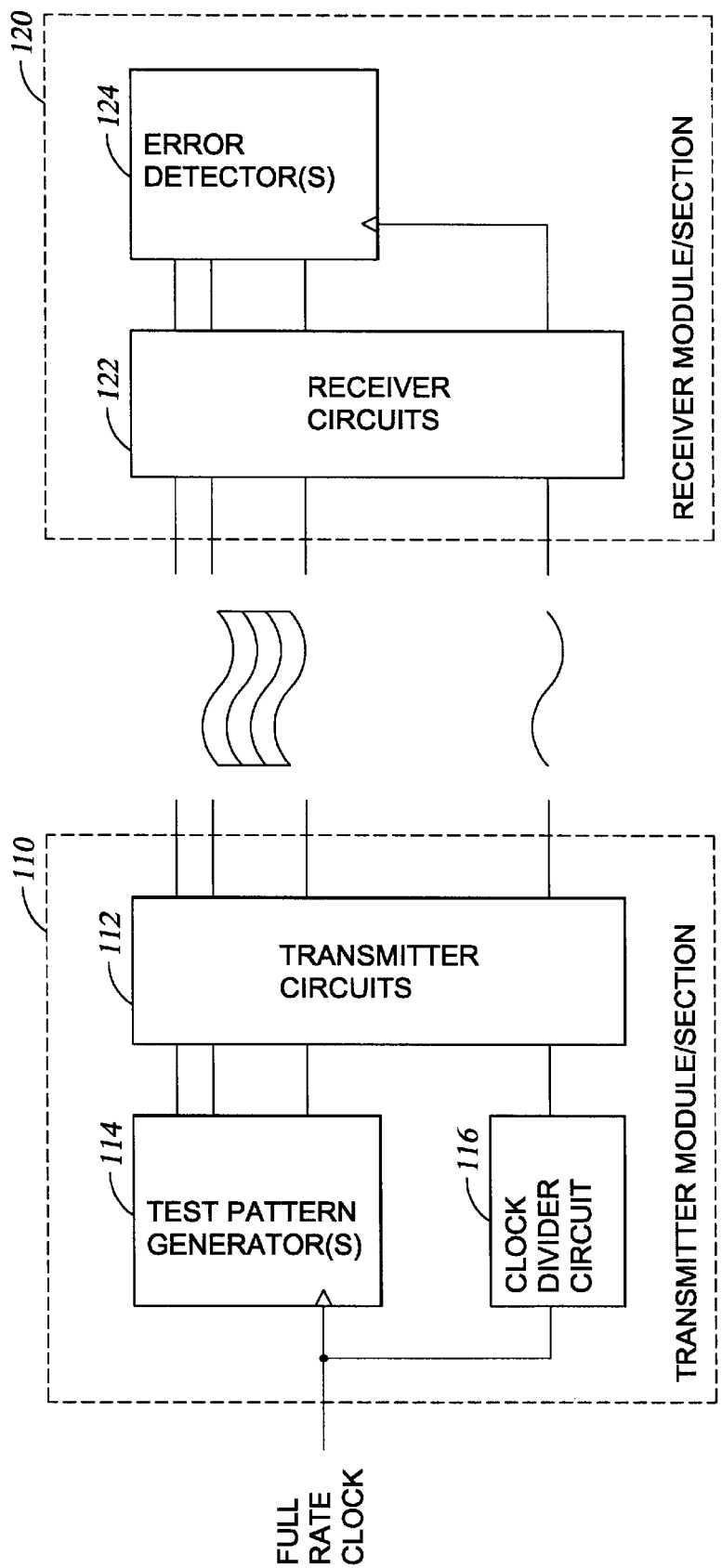
FIG. 1 is a schematic diagram illustrating an architecture for built-in self-testing of a parallel optical transceiver.

FIG. 1 is a schematic diagram illustrating an architecture for built-in self-testing of a parallel optical transceiver. As shown in FIG. 1, a parallel optical transceiver 100 generally comprises a transmitter module 110 and a receiver module 120. The parallel optical transceiver typically is housed in the same package, and each of the transmitter module and receiver module includes a plurality of input connections and output connections corresponding to the number of channels provided by the parallel optical transceiver. For example, a twelve channel parallel optical transceiver includes a twelve channel transmitter module having twelve sets of input/output connections and a twelve channel receiver module having twelve sets of input/output connections. As shown in FIG. 1, the output connections of the transmitter module are connected to the input connections of the receiver module. To test an individual parallel optical transceiver, the transceiver may be disposed on a test fixture which is configured to facilitate optical transmission of signals from the output connections of the transmitter module to the input connections of the receiver module. Alternatively, a test fixture may be configured to facilitate optical transmission of signals from the output connections of the transmitter module of a first transceiver to the input connections of the receiver module of a second transceiver while signals are transmitted from the output connections of the transmitter module of the second transceiver to the input connections of the receiver module of the first transceiver. As a further alternative, a test fixture may be configured to link a plurality of transceivers in a chain (e.g., utilizing hardware such as optical wraps) to further increase the number of parallel optical transceivers tested at one time.

The transmitter module 110 includes a set of transmitter circuits 112, a test pattern generator 114, and a clock divider circuit 116. A clock signal may be supplied as the input signal to the test pattern generator 114 and the clock divider circuit 116. Alternatively, a built-in clock signal may be disposed as part of the transmitter module 110 to reduce the number of inputs for testing the transceiver. The set of transmitter circuits 112 includes corresponding numbers of input connections, laser drivers and output connections, according to the number of channels provided by the parallel optical transceiver. During normal operations of the parallel optical transceiver, the input connections of the transmitter module are connected to receive signals to be transmitted by the transceiver, and the output connections of the transmitter circuits 112 are connected to transmit data or signals to other devices or circuitry connected to the parallel optical transceiver.

During self-testing operation of the parallel optical transceiver, one input connection of the transmitter circuits 112 is connected to receive signals from the clock divider circuit 116 while the remainder of input connections of the transmitter circuits are connected to receive signals from the test pattern generator 114. The clock divider circuit 116 generates a half-clock signal which has a frequency that is one-half of the input clock signal frequency. The test pattern generator 114 may be a circuit which generates test data or signals to be transmitted through the transmitter circuits. One embodiment of the test pattern generator is described below with respect to FIG. 2A.

The receiver module 120 includes a set of receiver circuits 122 and an error detector 124. The set of receiver circuits 122 includes corresponding numbers of input connections, receiver circuit components and output connections, according to the number of channels provided by the parallel optical transceiver. During normal operations of the parallel optical transceiver, the input connections of the receiver module 122 are connected to receive signals transmitted to the transceiver, and the output connections of the receiver circuits 122 are connected to supply received data or signals to other devices or circuitry connected to the parallel optical transceiver.

During self-testing operation of the parallel optical transceiver, one input connection of the receiver circuits 122 is connected to receive signals transmitted through one of the transmitter channels representing signals from the clock divider circuit 116 while the remainder of input connections of the receiver circuits 122 are connected to receive signals transmitted through the remainder channels of the transmitter channels representing signals from the test pattern generator 114. The output connections of the receiver circuits 122 are connected to the error detector 124. The error detector 124 includes circuitry for detecting transmission errors utilizing a half-rate clock (i.e., clock signal having a frequency that is half of the input clock signal). Embodiments of the error detector 124 are described below with respect to FIGS. 3 and 4.

Figure 2A:
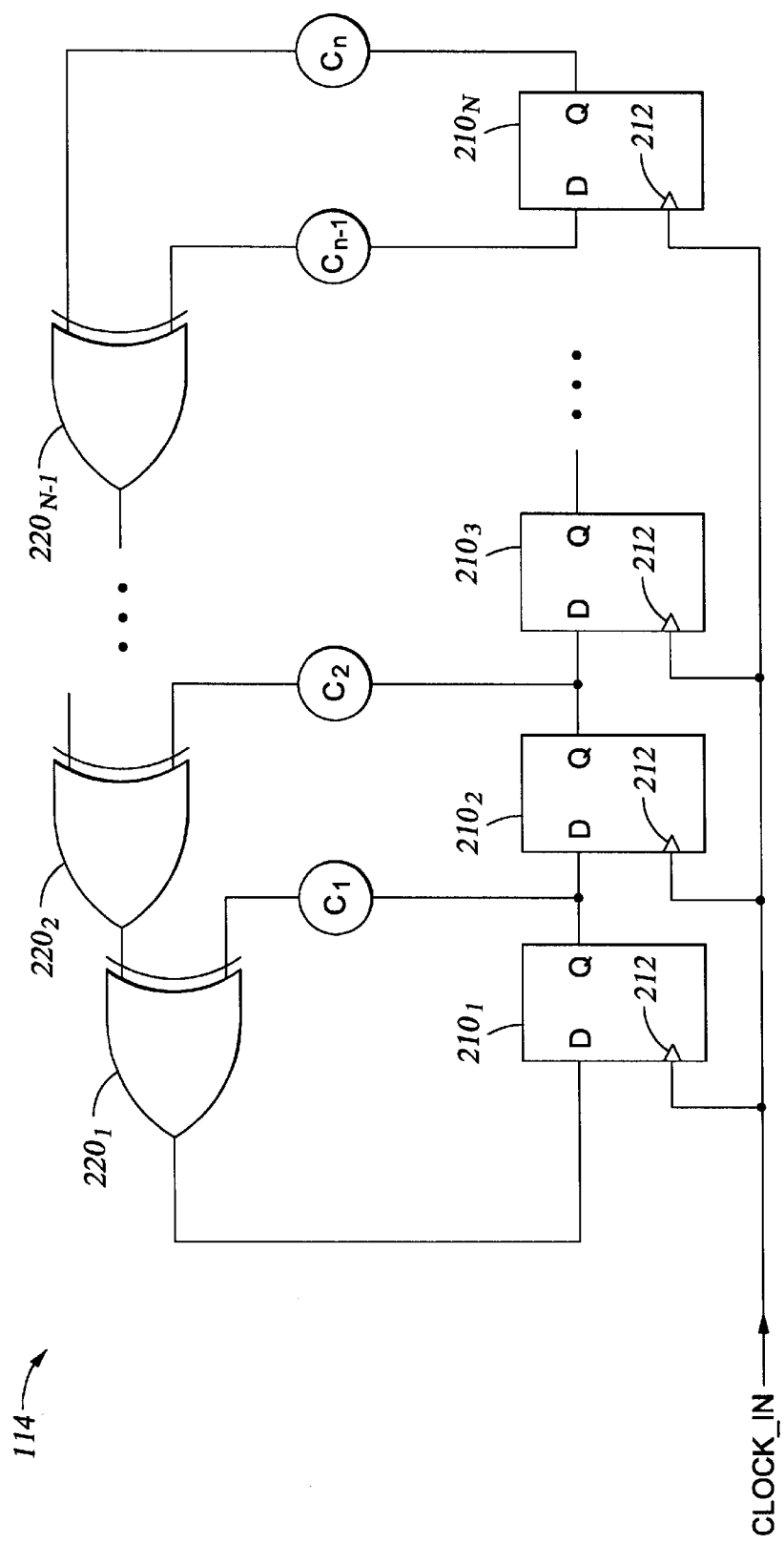
FIG. 2A is a schematic diagram of one embodiment of a test pattern generator.

FIG. 2A is a schematic diagram of one embodiment of a test pattern generator. The test pattern generator 114 may be a linear feedback shift register (LFSR) which includes a plurality of flip-flops $210_n$ and a plurality of exclusive OR logic gates 220. The test pattern generator 114 of FIG. 2A shows one configuration or type of LFSR useful for built-in self-testing of parallel optical transceivers. Although one embodiment of the invention is described utilizing one configuration or type of LFSR, other configurations or types of LFSR and other test pattern generators are contemplated by this invention. For example, the test pattern generator may comprise a programmable read only memory, an erasable programmable read only memory, and/or other hard-wired circuits disposed on the transceiver.

An input clock signal (i.e., full-rate clock signal) is connected to the clock input 212 of each of the flip-flops $210_1$ to $210_n$. The output of each flip-flop $210_1$ to $210_{n-1}$ is connected to the input of the next flip-flop $210_2$ to $210_n$, respectively. One or more outputs of the flip-flops $210_1$ to $210_n$ may be tapped/connected to one or more exclusive Or logic gates 220. As shown in FIG. 2A, the coefficients $C_1$ to $C_n$ are binary constants where "1" represents connection and "0" represents no connection from a flip-flip output to an input of an exclusive OR logic gate. If a particular coefficient is "0" (i.e., the output of the respective flip-flop is not tapped), the corresponding exclusive OR logic gate is not needed. Also, a particular exclusive OR logic gate may be omitted when no subsequent flip-flop output is tapped. The number of tapped flip-flop outputs and the number of exclusive OR logic gates may be selected according to the desired transmit pattern.

For example, in one embodiment, the test pattern generator may have all coefficients $C_1$ to $C_n$ being "1" which include all outputs of all flip-flops being tapped. Thus, seven flip-flops and six exclusive OR logic gates are utilized to form the test pattern generator 114. The output of the last flip-flop $210_n$ in the LFSR is connected to one input of the exclusive OR logic gate $220_{n-1}$ while the output of flip-flop $210_{n-1}$ is also tapped and connected to the exclusive OR logic gate $220_{n-1}$. In a feedback fashion, each output of the exclusive OR logic gate $220_{n-1}$ to $220_2$ is connected to the input of the previous exclusive OR logic gate $220_{n-2}$ to $220_1$, respectively. The output of the exclusive OR logic gate $220_1$ is fed back to the input of the first flip-flop $210_1$. Thus, the signals are propelled forward through the flip-flops 210 and fed back through the exclusive OR logic gates 220.

Figure 2B:
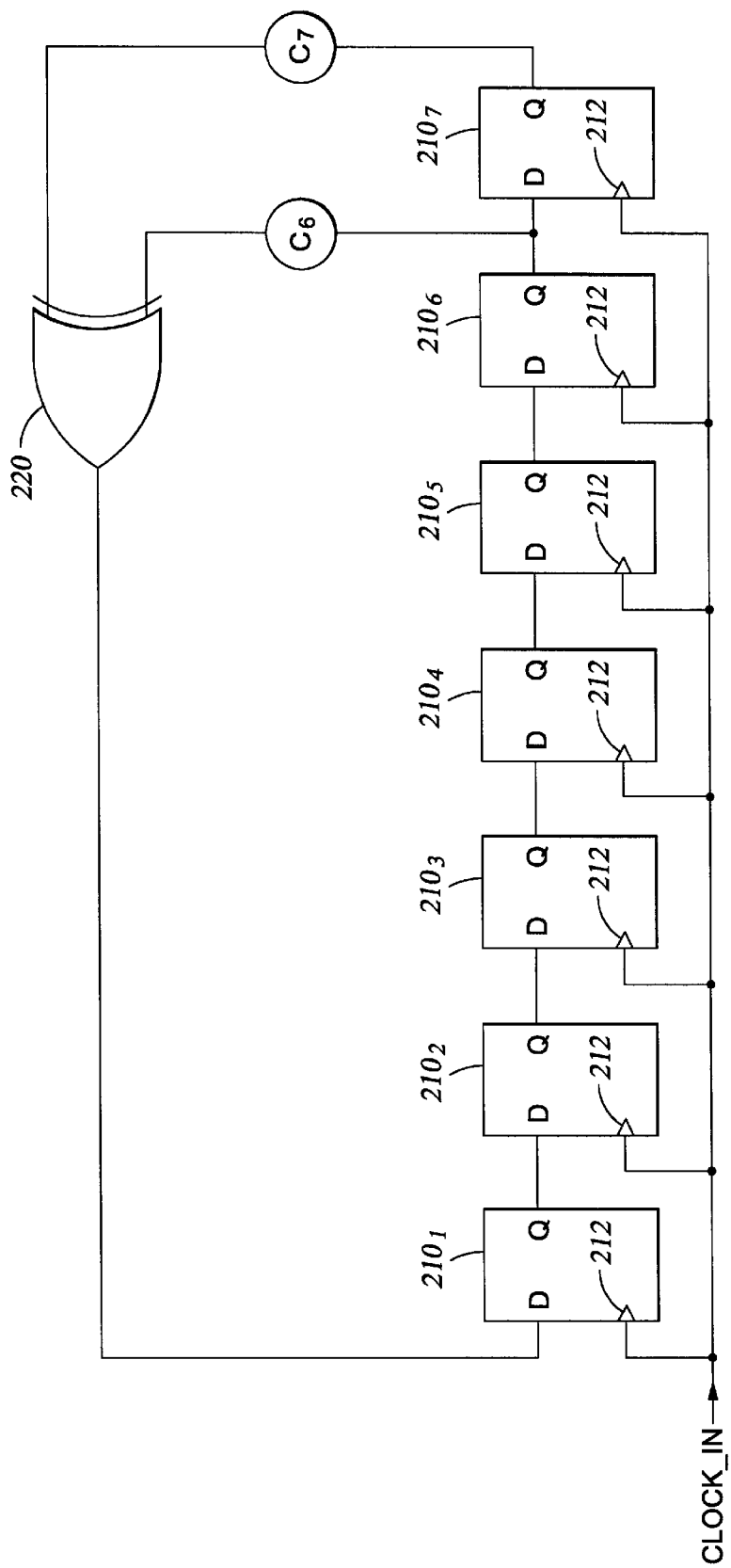
FIG. 2B is a schematic diagram of one example of one embodiment of a test pattern generator.

As another example, as shown in FIG. 2B, the test pattern generator may have only coefficients $C_6$ and $C_7$ being "1" which include only the outputs of flip-flops $210_6$ and $210_7$ being tapped. These tapped outputs are connected to the input of one exclusive OR logic gate $220_6$. The output of the exclusive OR logic gate $220_6$ is fed back to the input of the first flip-flop $210_1$.

Referring back to FIG. 1, the outputs of the flip-flops in the test pattern generator 114 are tapped to serve as inputs to the transmitter circuits 112. Each tapped flip-flop output may be connected to one or more channel inputs of the transmitter circuit, which then transmits the data signals through optical connections in the test fixture to the input connections of the receiver module 120. The received data signals may be buffered and/or amplified by the receiver circuits 122 before reaching the output connections of the receiver circuits 122. The output connection for each channel of the receiver circuits 122, except the channel carrying the half-rate clock signal, is connected to an error detection circuit which determines whether an individual channel is operating (i.e., transmitting and/or receiving) correctly. The channel carrying the half-rate clock signal may be tested separately. Alternatively, the channel carrying the half-rate clock signal may be assumed to be operating correctly if the half-rate clock signal was transmitted and received properly for the testing operation. For example, for a 12-channel parallel optical transceiver, the error detector 124 includes eleven error detection circuits, and the output from the channel carrying the half-rate clock signal is connected to each of the error detection circuits.

Figure 3A:
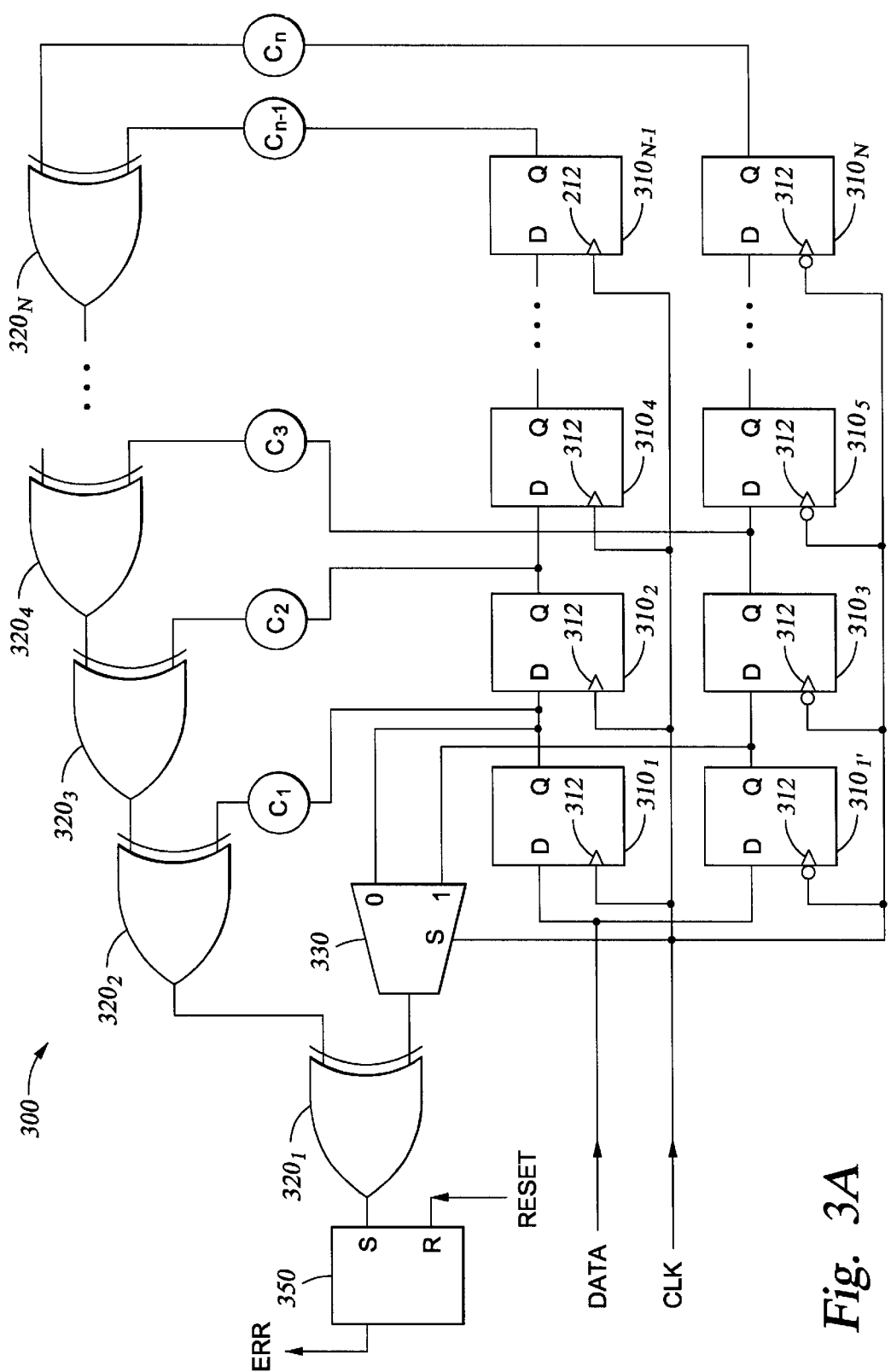
FIG. 3A is a schematic diagram of one embodiment of an error detection circuit.
Figure 3B:
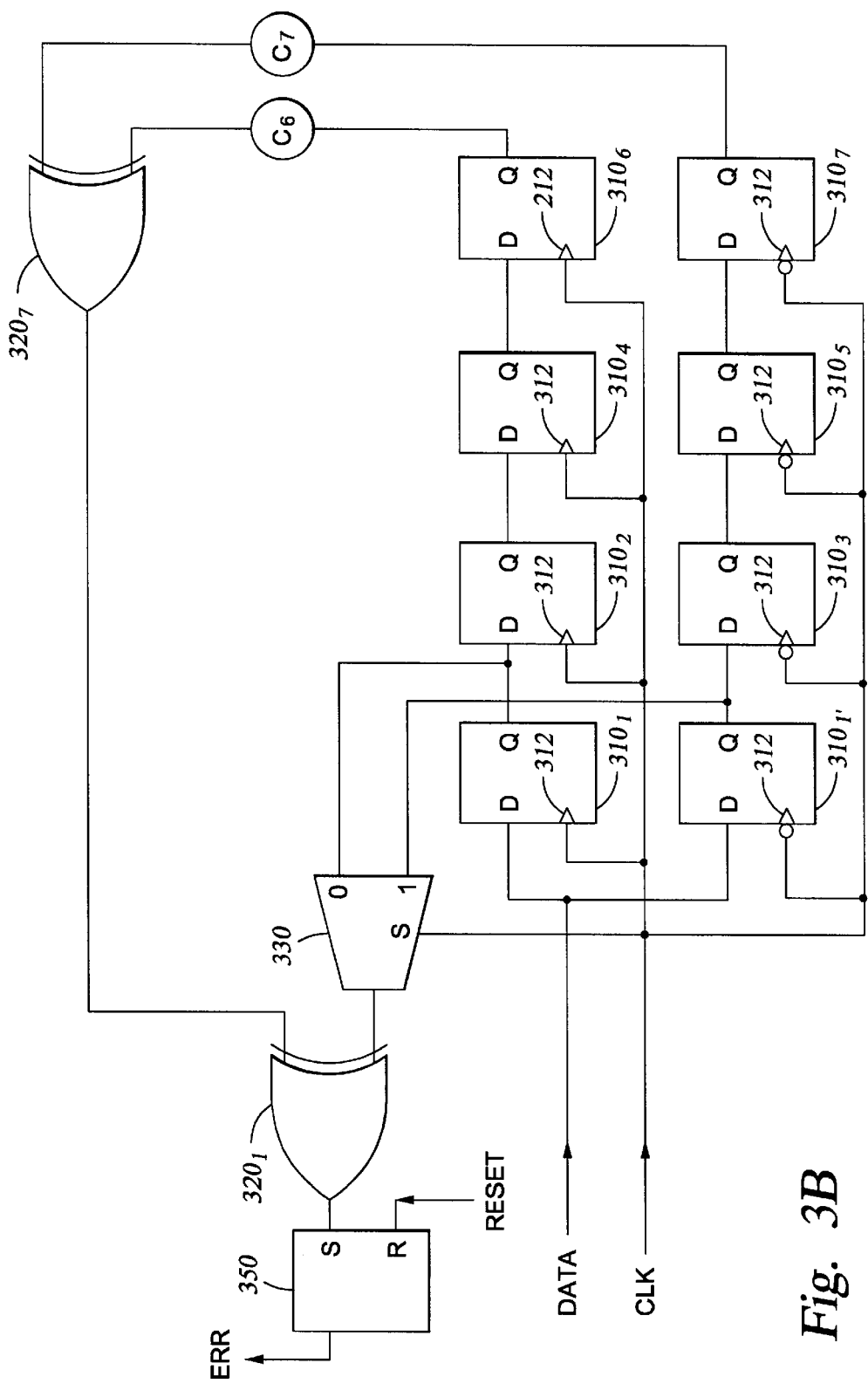
FIG. 3B is a schematic diagram of one example of one embodiment of an error detection circuit.

FIG. 3A is a schematic diagram of one embodiment of an error detection circuit. The error detection circuit 300 includes a plurality of flip-flops 310, one or more exclusive OR logic gates 320 and a multiplexer 330. The flip-flops 310 are disposed on two scan chains. A first plurality of flip-flops are rising-edge triggered and connected as a first scan chain, and a second plurality of flip-flops are falling-edge triggered and connected as a second scan chain. In one embodiment, N+1 (e.g., eight) flip-flops are utilized in the error detector corresponding to a test pattern generator having N (e.g., seven) flip-flops. The additional flip-flop $310_{1'}$ is disposed as the first flip-flop of the second scan chain. The received signals from one channel of the parallel optical transceiver is supplied to the inputs of the first flip-flop (e.g., flip-flop $310_1$ and flip-flop $310_{1'}$) of each scan chain. The half-rate clock is transmitted through another channel of the parallel optical transceiver and supplied to the clock input 312 of each flip-flop. The flip-flops in each scan chain are connected in series (i.e., output of one flip flop is connected to the input of the next flip-flop). For example, in an eight flip-flop error detector, the first scan chain may comprise flip-flops $310_1, 310_2, 310_4$, and $310_6$ connected in one series, while the second scan chain may comprise flip-flops $310_{1'}, 310_3, 310_5$, and $310_7$ connected in another series.

One or more outputs from the flip-flops 310 may be tapped and connected to one or more exclusive OR logic gates 320 to determine whether an error has occurred. The flip-flop output(s) to be tapped are selected correspondingly to the tapped flip-flops in the test pattern generator (i.e., the coefficients in the error detector have the same values as the coefficients in the test pattern generator). The one or more tapped outputs of the flip-flops $310_1$ to $310_n$ are connected to one or more exclusive OR logic gates $320_1$ to $320_n$ in a feedback arrangement. The coefficient value $C_1$ to $C_n$ indicate whether a connection is present for a tapped output of a flip-flop $310_1$ to $310_n$. As shown in FIG. 3A, tapped outputs of flip-flops $310_1$ to $310_{n-1}$ generally correspond to exclusive OR logic gates $320_2$ to $320_n$, respectively, and the tapped outputs of flip-flop $310_n$ also corresponds to exclusive OR logic gate $320_n$. If a coefficient value (i.e., $C_1$ to $C_n$) is "0", the corresponding exclusive OR logic gate may be omitted. Also, a particular exclusive OR logic gate may be omitted when no subsequent flip-flop output is tapped.

The arrangement and connection of exclusive OR logic gates in the error detector corresponds to the arrangement and connection of the exclusive OR logic gates in the test pattern generator. For example, in an error detection circuit having eight flip-flops as shown tin FIG. 3B, the outputs of the last flip-flops of each scan chain (i.e., flip-flops $310_6$ and $310_7$) are tapped and connected to one exclusive OR logic gate $320_7$, corresponding to a test pattern generator having only the outputs of flip-flops $210_6$ and $210_7$ being tapped as described in one example above. In this example, coefficient values $C_1$ to $C_5$ are "0", and the corresponding exclusive OR logic gates $320_2$ to $320_6$ are omitted, resulting in connection of the output from exclusive OR logic gate $320_7$ to the input of exclusive OR logic gate $320_1$.

The exclusive OR logic gate 320, receives signals from the multiplexer 330 and from the feedback arrangement of one or more tapped outputs of flip-flops. Tappeded outputs of the first flip-flops ($310_1$ and $310_{1'}$) of each scan chain are connected as inputs to the multiplexer 330. The half-rate clock is also supplied as the select input to the multiplexer 330, and the multiplexer 330 switches its output between the tapped outputs of flip-flops $310_1$ and $310_{1'}$ based on the half-rate clock signal. The output of multiplexer 330 is connected to an input of the exclusive OR logic gate $320_1$.

The exclusive OR logic gate $320_1$ provides an error signal output when its input signals do not match. A set-reset (SR) latch 350 may be connected to the output of the exclusive OR logic gate 340 to indicate that an error has occurred. The SR latch 350 may hold the error status until a reset signal is provided to the reset input of the SR latch 350.

The error detector described above provides one error output for each channel of the parallel optical transceiver except for the channel carrying the half-rate clock signal. To reduce the number of outputs necessary for evaluating the operation of the parallel optical transceiver, a multiplexed error detector may be disposed on the parallel optical transceiver to provide an output indicating a selected channel (e.g., selected by a channel multiplexer) and the associated error status. FIG. 4 is a schematic diagram of one embodiment of a multiplexed error detector. The multiplexed error detector 400 includes a plurality of error detection circuits 300 (as described above in FIG. 3A), a channel multiplexer 410 and a counter 420. The outputs of the SR latches 350 of the plurality of error detection circuits 300 are connected to the inputs of the channel multiplexer 410, which selects the channel to be displayed according to the counter 420. The channel multiplexer 410 may be an (n+1):1 multiplexer to accommodate (n+1) total number of channels (e.g., channel 0 to channel n as shown in FIG. 4).

The counter 420 may be a counter circuit configured to repeatedly rotate the channel being selected. For example, the counter 420 may be an (n+1) bit one-hot ripple counter, wherein (n+1) bit corresponds to the total number of channels (e.g., channel 0 to channel n) being tested (e.g., an eleven-bit ripple counter for a twelve channel parallel optical transceiver). A counter or poll clock signal may be utilized as the input signal to the counter to set the counter speed. In one embodiment, the poll clock signal is sufficiently slow (e.g., less than about 120 Hz) to allow human observation of the error status and selected channel. The output of the counter 420 is connected to the select of the channel multiplexer 410, which then selectively outputs the error status of the selected channel. For example, utilizing the (n+1) bit ripple counter, the output signal, S<0:n>, rotates selection of channels 0 to channel n by the multiplexer 410. The output of the counter 420 is also converted to a display output which displays the channel number of the selected channel. Thus, an operator may visually observe the error status of each channel of the parallel optical transceiver being tested.

The output of the ripple counter may also be utilized to clear error status of the SR latches 350 so that new errors may be detected and displayed. For example, utilizing the (n+1) bit counter, the $i^{th}$ bit may be utilized to provide the reset signal to the reset input of the SR latch 350 of channel i-1, and the "0" bit may be utilized to provide the reset signal to the reset input of the SR latch 350 of the last channel (i.e., channel n).

The present invention provides a built-in self-test (BIST) circuit disposed on a parallel optical transceiver which may be utilized in development and manufacturing test and field debug of the parallel optical transceiver. The BIST serves as a preliminary screen of proper link functions of the parallel optical transceiver. For debugging purposes, the BIST identifies the faulty channel(s) of the parallel optical transceiver. Also, the BIST exercises optical links with full-rate data patterns that closely resemble those transmitted in typical functional or operational mode. The BIST does not require optical transmission of a full-rate clock signal and may be configured to minimize the number of inputs and outputs (e.g., one input and two outputs). Also, the BIST may be configured to utilize existing test equipment designed for serial and low-speed testing.

While the foregoing is directed to the preferred embodiment of the present invention, other and further embodiments of the invention may be devised without departing from the basic scope thereof, and the scope thereof is determined by the claims that follow.

What is claimed is:

1. A built-in self-testing (BIST) parallel optical transceiver, comprising:
   a full-rate clock test pattern generator connected to one or more transmitter channels;
   a clock divider circuit connected to provide a half-rate clock signal to one of the one or more transmitter channels; and
   an error detector comprising one or more error detection circuits connected to one or more receiver channels, the one or more error detection circuits configured to receive the half-rate clock signal.

2. The apparatus of claim 1 wherein each error detection circuit comprises:
   a first scan chain comprising a plurality of rising-edge-triggered flip-flops configured to receive the half-rate clock signal;
   a second scan chain comprising a plurality of falling-edge-triggered flip-flops configured to receive the half-rate clock signal; and
   an error output connected to the first and second scan chains.

3. The apparatus of claim 2 wherein the error output comprises one or more logic devices connected to a set-reset (SR) latch, the one or more logic devices connected to receive signals from the first and second scan chains.

4. The apparatus of claim 2 wherein the error output comprises:
   a multiplexer connected to select a tapped output from a first flip-flop of the first scan chain and a first flip-flop of the second chain; and
   one or more exclusive OR gates connected to receive signal from the multiplexer and from one or more outputs from the first and second scan chains.

5. The apparatus of claim 2 wherein the error output comprises:
   a multiplexer connected to select a tapped output from a first flip-flop of the first scan chain and a first flip-flop of the second chain; and
   a first exclusive OR gate connected to receive signal from the multiplexer and from a feedback network comprising one or more additional exclusive OR gates connected to receive signals from two or more outputs from the first and second scan chains.

6. The apparatus of claim 1 wherein the error detector further comprises a multiplexer connected to the one or more error detection circuits.

7. The apparatus of claim 6 wherein the error detector further comprises a counter connected to the multiplexer and a display configured to display a channel value of the counter.

8. The apparatus of claim 1 wherein the test pattern generator comprises a linear feedback shift register (LFSR) connected to a full-rate clock signal.

9. The apparatus of claim 1 further comprising a built-in full-rate clock connected to the test pattern generator and the clock divider circuit.

10. A built-in self-testing parallel optical transceiver, comprising:
    a full-rate clock test pattern generator connected to one or more transmitter channels;
    a clock divider circuit connected to provide a half-rate clock signal to one of the one or more transmitter channels; and
    an error detector comprising one or more error detection circuits connected to one or more receiver channels, each error detection circuit comprising:
       a first scan chain comprising a plurality of rising-edge-triggered flip-flops configured to receive the half-rate clock signal;
       a second scan chain comprising a plurality of falling-edge-triggered flip-flops configured to receive the half-rate clock signal; and
       an error output connected to the first and second scan chains.

11. The transceiver of claim 10 wherein the error output comprises one or more logic devices connected to a set-reset (SR) latch, the one or more logic devices connected to receive signals from the first and second scan chains.

12. The transceiver of claim 11 wherein the error detector further comprises a channel multiplexer connected to the one or more error detection circuits.

13. The transceiver of claim 12 wherein the error detector further comprises a counter connected to the channel multiplexer and a display configured to display a channel value of the counter.

14. The transceiver of claim 10 wherein the error output comprises:
    a multiplexer connected to select a tapped output from a first flip-flop of the first scan chain and a first flip-flop of the second chain; and
    one or more exclusive OR gates connected to receive signal from the multiplexer and from one or more outputs from the first and second scan chains.

15. The transceiver of claim 10 wherein the error output comprises:
    a multiplexer connected to select a tapped output from a first flip-flop of the first scan chain and a first flip-flop of the second chain; and
    a first exclusive OR gate connected to receive signal from the multiplexer and from a feedback network comprising one or more additional exclusive OR gates connected to receive signals from two or more outputs from the first and second scan chains.

16. The transceiver of claim 10 wherein the test pattern generator comprises a linear feedback shift register (LFSR) connected to a full-rate clock signal.

17. The transceiver of claim 10, further comprising a built-in full-rate clock connected to the test pattern generator and the clock divider circuit.

18. An apparatus for testing a parallel optical transceiver, comprising:
  a full-rate clock test pattern generator connected to one or more transmitter channels of the parallel optical transceiver;
  a clock divider circuit connected to provide a half-rate clock signal to one of the one or more transmitter channels;
  an error detector comprising one or more error detection circuits connected to one or more receiver channels of the parallel optical transceiver, the one or more error detection circuits configured to receive the half-rate clock signal; and
  a test fixture comprising optical connections connecting outputs of the one or more transmitter channels to inputs of the one or more receiver channels.

19. The apparatus of claim 18 wherein each error detection circuit comprises:
  a first scan chain comprising a plurality of rising-edge-triggered flip-flops configured to receive the half-rate clock signal;
  a second scan chain comprising a plurality of falling-edge-triggered flip-flops configured to receive the half-rate clock signal; and
  an error output connected to the first and second scan chains.

20. The apparatus of claim 19 wherein the error output comprises one or more logic devices connected to a set-reset (SR) latch, the one or more logic devices connected to receive signals from the first and second scan chains.

21. The apparatus of claim 19 wherein the error output comprises:
  a multiplexer connected to select a tapped output from a first flip-flop of the first scan chain and a first flip-flap of the second chain; and
  one or more exclusive OR gates connected to receive signal from the multiplexer and from one or more outputs from the first and second scan chains.

22. The apparatus of claim 19 wherein the error output comprises:
  a multiplexer connected to select a tapped output from a first flip-flop of the first scan chain and a first flip-flop of the second chain; and
  a first exclusive OR gate connected to receive signal from the multiplexer and from a feedback network comprising one or more additional exclusive OR gates connected to receive signals from two or more outputs from the first and second scan chains.

23. The apparatus of claim 18 wherein the error detector further comprises a multiplexer connected to the one or more error detection circuits.

24. The apparatus of claim 23 wherein the error detector further comprises a counter connected to the multiplexer and a display configured to display a channel value of the counter.

25. The apparatus of claim 18 wherein the test pattern generator comprises a linear feedback shift register (LFSR) connected to a full-rate clock signal.

26. A method for testing a parallel optical transceiver, comprising:
  generating a full-rate clock test pattern to one or more transmitter channels;
  providing a half-rate clock signal to one of the one or more transmitter channels utilizing a clock divider circuit;
  transmitting full-rate clock test pattern and half-rate clock signal through the one or more transmitter channels to one or more corresponding receiver channels; and
  detecting error utilizing an error detector comprising one or more error detection circuits connected to the one or more receiver channels, the one or more error detection circuits configured to receive the half-rate clock signal.

27. The method of claim 26 wherein the step of detecting error comprises:
  providing the half-rate clock signal to a first scan chain comprising a plurality of rising-edge-triggered flip-flops;
  providing the half-rate clock signal to a second scan chain comprising a plurality of falling-edge-triggered flip-flops; and
  determining an error output from the first and second scan chain outputs.

28. The method of claim 26, further comprising:
  multiplexing outputs of the one or more error detection circuits.

\* \* \* \* \*